United States Patent
Morgan

(10) Patent No.: US 6,463,571 B1
(45) Date of Patent: Oct. 8, 2002

(54) FULL-CHIP EXTRACTION OF INTERCONNECT PARASITIC DATA

(75) Inventor: David A. Morgan, Fort Collins, CO (US)

(73) Assignee: LSI Logic Corporation, Milpitas, CA (US)

(*) Notice: Subject to any disclaimer, the term of this patent is extended or adjusted under 35 U.S.C. 154(b) by 85 days.

(21) Appl. No.: 09/808,549

(22) Filed: Mar. 14, 2001

(51) Int. Cl.[7] .............................................. G06F 17/50

(52) U.S. Cl. ............................................ 716/5; 716/10

(58) Field of Search ............................. 716/5, 10, 6, 7, 716/8, 9

(56) References Cited

U.S. PATENT DOCUMENTS 6,363,516 B1 * 3/2002 Cano et al. .................... 716/10

* cited by examiner

Primary Examiner—Tom Thomas
Assistant Examiner—Thien F Tran
(74) Attorney, Agent, or Firm—Fitch, Even, Tabin & Flannery

(57) ABSTRACT

In this method for hierarchical extraction of interconnect parasitic data for integrated circuits, a representation of coupled interconnects and polygon data copied from an upper level to a lower level is simplified so that the coupled interconnects and the polygon data are considered to be ground wires. This method also features instance-specific management of hardmac data from copied hardmac views to create SPEF files using both chip level and macro level back-annotation in a hierarchical representation.

10 Claims, 5 Drawing Sheets

FULL-CHIP EXTRACTION OF INTERCONNECT PARASITIC DATA

BACKGROUND OF THE INVENTION

The present invention relates generally to design tools for integrated circuits. More specifically, but without limitation thereto, the present invention relates to characterizing parasitic effects associated with placing each instance of a circuit building block, typically called a core, hard macro, or "hardmac", in an integrated circuit chip design.

When a hardmac is instantiated in a chip design, coupling effects between chip level interconnects routed over the hardmac or other closely adjacent metal and the hardmac may cause the chip to malfunction. Current methods for ensuring that these coupling effects, commonly called parasitics, will not cause the chip to malfunction when the hardmac is incorporated into the chip design generally either attempt to deal with the problem from the logic design perspective or from the physical design perspective.

From the logic design perspective, the hardmac designer is expected to account for best and worst case coupling effects of the design such that the circuit will function correctly across the range of possible environmental conditions. The effectiveness of this approach depends on how accurate the prediction is of the effects from the environmental conditions, and whether the effects represent too much variance to allow for effective design.

From the physical design perspective, routing blockages or metal sheets are placed over the core to create a specific environment. In some cases, this approach is preferable, for example, to shield mixed signal blocks that contain both analog and digital circuitry. Analog circuitry does not have the noise protection of logic thresholds inherent to digital circuitry and is therefore more sensitive to coupling effects. While the metal sheet affords signal integrity and predictability, it also imposes a cost on performance due to coupling between the metal plate and interconnect lines within the hardmac. In other designs, the metal sheet may not be present, so the hardmac must be designed to operate under the worst case coupling extremes of no coupling and maximum coupling.

There are trade-offs between these approaches. If the physical designer is given complete control over the physical implementation to provide the best routing solution, the design problem may be too difficult to solve. If a precise physical implementation environment is enforced, i.e., no routing over the hardmacs, it may not be possible to meet timing objectives of the design, because the routing obstructions presented by the hardmacs could force large meandering wiring routes at the chip level. On the other hand, attempting to account for the coupling effects of routing interconnects over a hardmac and other closely adjacent metal typically requires "flattening" the hierarchical level chip design, i.e., expanding the top level of the design into a single level that includes all the lower levels and performing a parasitic extraction. A parasitic extraction predicts the impedance of each interconnect due to coupling effects from adjacent interconnects and other metal.

As the size of chip designs continues to grow exponentially through hardmac reuse, the size of corresponding chip level databases increases accordingly. This explosion of data at the very least would result in longer run times to perform parasitic extraction and therefore a longer time-to-market. Even worse, the data explosion could result in failure of design tools to operate due to capacity limitations inherent in the design tools and/or the machines on which the design tools are executed.

SUMMARY OF THE INVENTION

The present invention advantageously addresses the problems above as well as other problems by providing a method for generating a hierarchical Standard Parasitic Exchange Format file for accurately performing a full-chip extraction of interconnect parasitic data for an integrated circuit.

In one embodiment, the present invention may be characterized as a method for full-chip hierarchical extraction of interconnect parasitic data for an integrated circuit that includes the steps of (a) copying a hardmac view of an instantiated hardmac into a macro level temporary view; (b) finding an instance of the hardmac in a chip level design from a chip level detailed view; (c) calculating bounding box coordinates of the instance of the hardmac from the chip level detailed view; (d) copying coupled interconnect data inside the bounding box from the chip level detailed view into the macro level temporary view; and (e) generating a macro level SPEF file from the macro level temporary view.

BRIEF DESCRIPTION OF THE DRAWINGS

The above and other aspects, features and advantages of the present invention will be more apparent from the following more specific description thereof, presented in conjunction with the following drawings wherein.

DETAILED DESCRIPTION OF THE DRAWINGS

The following description is presented to disclose the currently known best mode for making and using the present invention. The scope of the invention is defined by the claims.

The method for extraction of interconnect parasitic data of the present invention advantageously exploits the hierarchical, i.e., incremental implementation of building blocks (hard macros or "hardmacs"), to represent parasitic data in standard IEEE Standard Parasitic Exchange Format (SPEF) files. The hierarchical implementation of hardmacs allows the physical implementation of a chip design to proceed in parallel using separate resources.

The chip level layout information is typically contained in sets of files called views. Each view includes selected information about the chip level design. Information regarding the logical netlist and the physical areas of the standard cells in the chip level layout and the routing of interconnects among them is included in a detailed view. Design tools for integrated circuit design typically access layout information contained in the views from a database.

Figure 1:
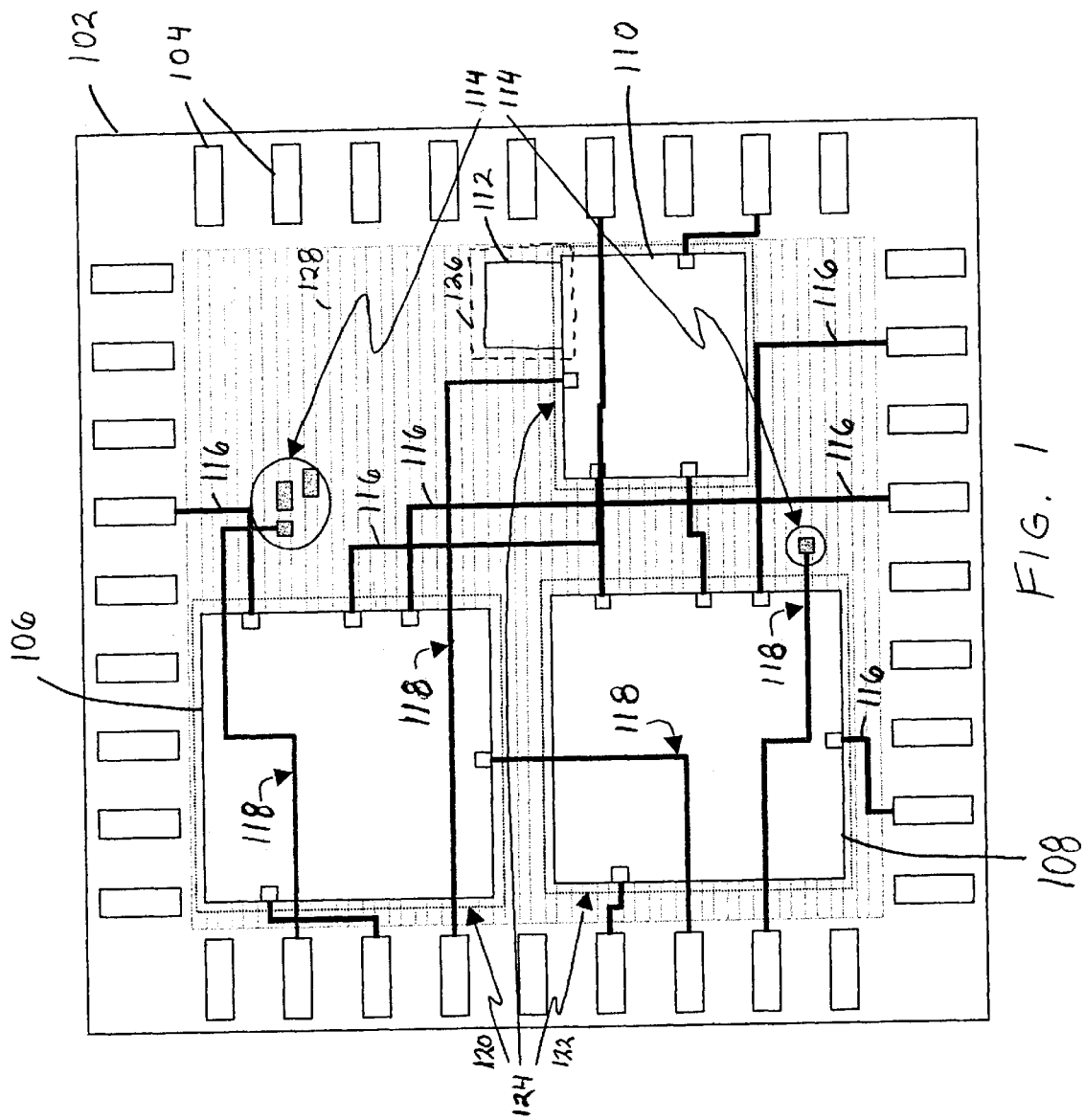
FIG. 1 is a chip level layout for illustrating a method for extraction of interconnect parasitic data for an integrated circuit according to an embodiment of the present invention.

FIG. 1 is a chip level layout for illustrating a method for extraction of interconnect parasitic data for an integrated circuit according to an embodiment of the present invention. Shown in FIG. 1 are an integrated circuit chip 102, bonding pads 104, a first instance 106 of a hardmac (A), a second instance 108 of the hardmac (A), an instance 110 of a hardmac (B), an instance 112 of a hardmac (C), instances 114 of standard cells, non-coupled interconnects 116, coupled interconnects 118, a bounding box 120 defined for the first instance of the hardmac (A), a bounding box 122 defined for the second instance of the hard macro (A), a bounding box 124 defined for the hardmac (B), a bounding box 126 defined for the hardmac (C), and standard cell placement rows 128.

The integrated circuit chip 102 receives a number of input signals and generates a number of output signals that are connected externally via the bonding pads 104. Included on the integrated circuit chip 102 are the first instance 106 of the hardmac (A), the second instance 108 of the hardmac (A), the instance 110 of the hardmac (B), the instance 112 of the hardmac (C), and the instances 114 of standard cells. Surrounding each of the first instance 106 of the hardmac (A), the second instance 108 of the hardmac (A), and the instance 110 of a hardmac (B) are the bounding box 120, the bounding box 122, and the bounding box 124, respectively. Each of the bounding boxes 120, 122, 124, and 126 extend a distance beyond the perimeter of the corresponding hardmac at which coupling effects are negligible.

In this example, the non-coupled interconnects 116 are the chip level interconnects that are routed outside the bounding boxes 120, 122, 124, and 126. The coupled interconnects 118 are the chip level interconnects that cross over the bounding boxes 120, 122, and 124. Because the bounding boxes 124 and 126 each include a portion of adjacent hardmacs (C) and (B), the internal interconnects (not shown) within the portion of the adjacent hardmac enclosed by the bounding boxes 124 and 126 are also coupled interconnects 118. These internal interconnects, or polygon data, may also be included in the coupled interconnects 118 for each adjacent hardmac and are defined in the corresponding hardmac detailed view.

Figure 2:
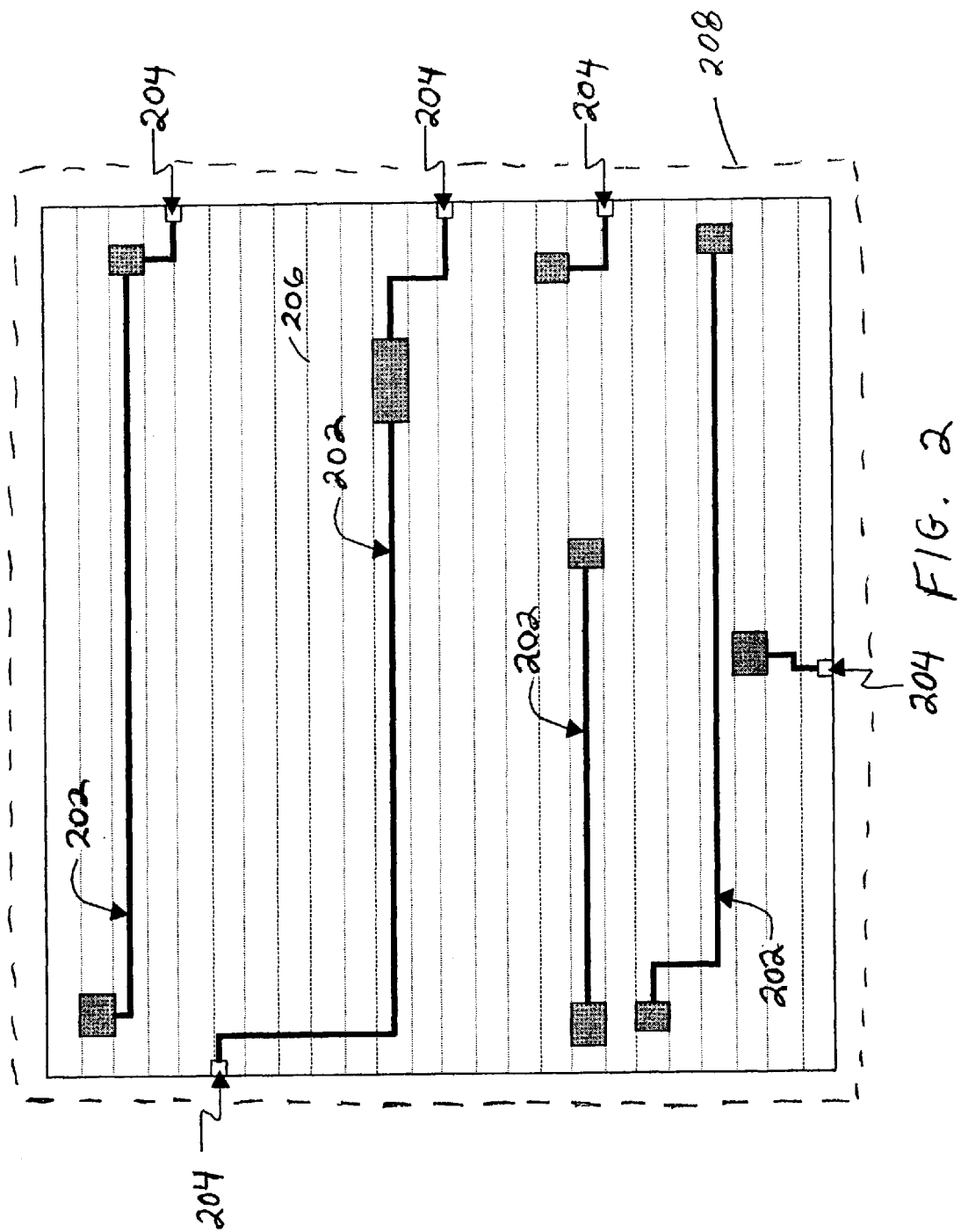
FIG. 2 is a diagram of the hardmac (A) in FIG. 1.

FIG. 2 is a diagram of the hardmac (A) in FIG. 1. Shown in FIG. 2 are internal interconnects 202, hardmac pins 204, standard cell placement rows 206, and a bounding box 208. The coordinates of the internal interconnects 202 along with other netlist information is contained in the detailed view of the hardmac (A). The coordinates of the bounding box 208 are the relative coordinates of the hardmac (A) extended to a distance at which coupling effects are negligible, for example, two routing tracks/grids (not shown).

Because the coupled chip level interconnects 118 in FIG. 1 are different for each instance 106 and 108 of the hardmac (A), a separate macro level parasitic extraction file is needed to describe the effect of the coupled interconnects 118 within the bounding box 208 for each instance of the hardmac (A). Each macro level parasitic extraction file may be generated by copying the hardmac detailed view into a separate macro level temporary view and copying the information within the bounding box 208 including the coupled interconnects 118 from the chip level detailed view and polygon data from adjacent hardmacs into the macro level temporary view. The macro level temporary view thus contains the detailed hardmac view, polygon data from adjacent hardmacs, and the coupled interconnects 118 from the chip level detailed view that lie inside the bounding box 120.

Figure 3:
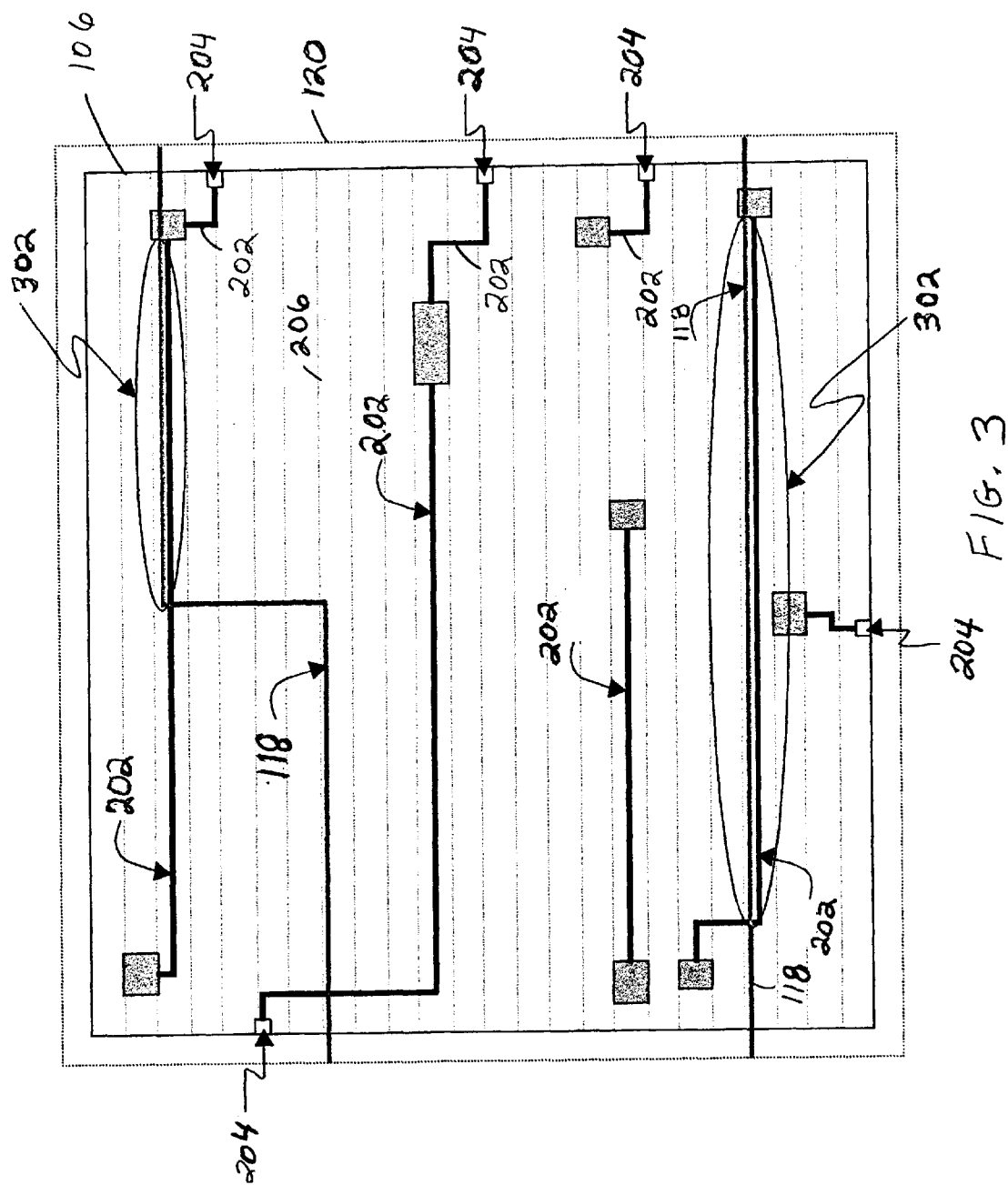
FIG. 3 is a diagram of the first instance of the hardmac (A) in FIG. 2 after copying the coupled interconnects from FIG. 1.

FIG. 3 is a diagram of the first instance 106 of the hardmac (A) in FIG. 2 represented in the macro level temporary view for the first instance 106 of the hardmac (A). The enclosed areas 302 indicate where coupling effects between the coupled interconnects 118 and the internal interconnects 202 are significant. These coupling effects may be determined by performing a parasitic extraction of the modified macro level temporary view according to well known techniques and saved in a Standard Parasitic Exchange Format (SPEF) file. An example of commercially available software for performing the parasitic extraction and generating an SPEF file is the STAR-RC/XT extraction engine from Avant! Corporation in Fremont, Calif.

Figure 4:
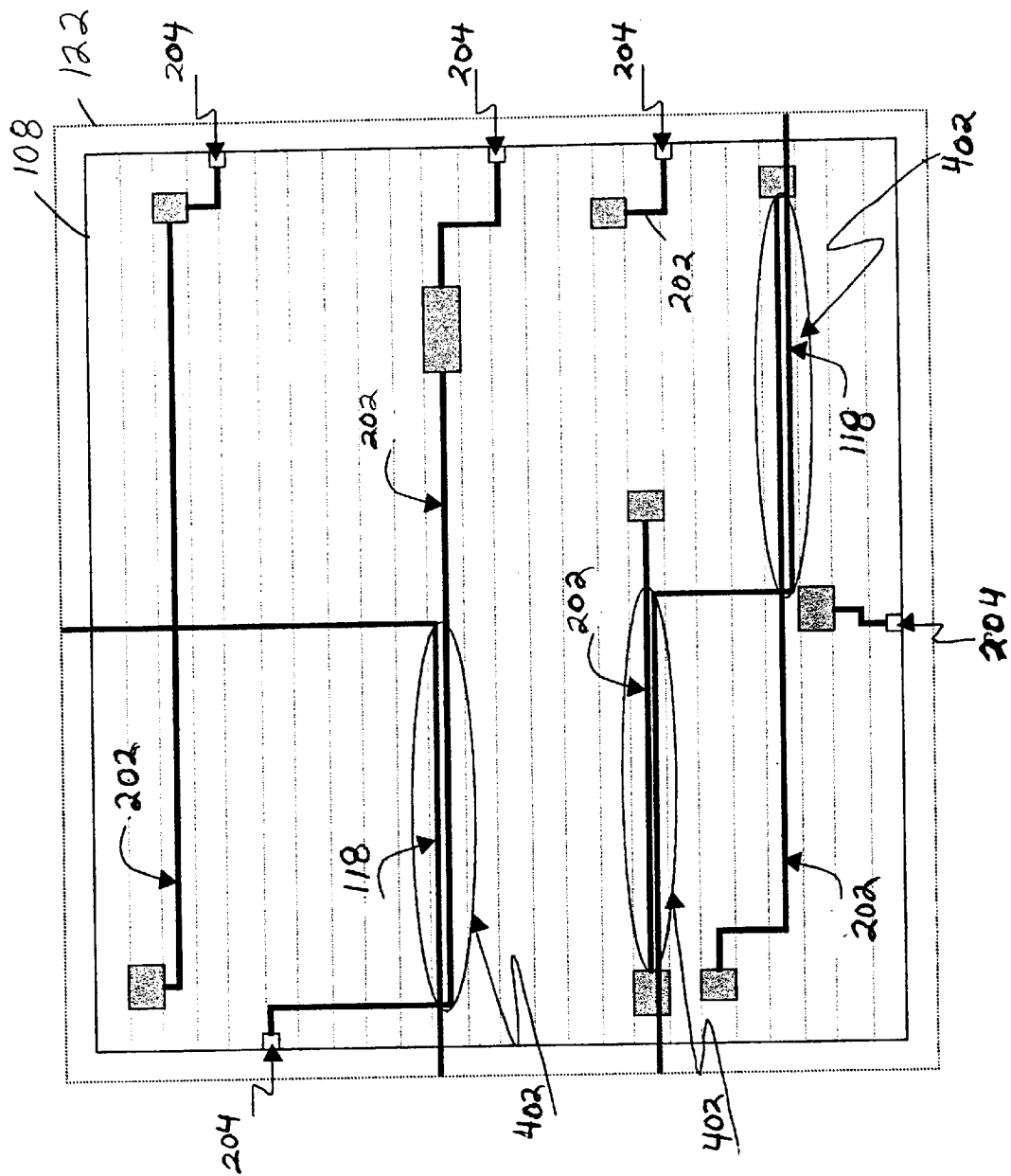
FIG. 4 is a diagram of the second instance of the hardmac (A) in FIG. 2 after copying the coupled interconnects from FIG. 1.

FIG. 4 is a diagram of the second instance 108 of the hardmac (A) in FIG. 2 represented in the macro level temporary view for the second instance 108 of the hardmac (A). The enclosed areas 402 indicate where coupling effects between the coupled interconnects 118 and the internal interconnects 202 are significant. These coupling effects may be determined by performing a parasitic extraction of the modified macro level temporary view in a similar-manner as for the first instance 106 of the hardmac (A) and saved in a macro level Standard Parasitic Exchange Format (SPEF) file. Each of the macro level Standard Parasitic Exchange Format (SPEF) files is assigned a separate name, typically a relative pathname, corresponding to each instance of the hardmac (A).

Standard Parasitic Exchange Format (SPEF) files may be created as described above for each instance of each macro in the integrated circuit 102. A parasitic extraction is then performed on the chip level detailed view according to well known techniques to create a top level SPEF file. The names of the macro level SPEF files are inserted into the corresponding macro references in the top level SPEF file to create a full-chip, hierarchical top level SPEF file. The method described above need not begin at the level immediately below the top level of a typical hierarchical chip design, but may be applied recursively from any level to create the next higher level SPEF file and so on to create the full-chip SPEF file at the top level. The full-chip parasitic extraction may then be performed on the hierarchical top level SPEF file using hierarchical parasitic extraction methods that operate in parallel on each level and therefore require much less computer resources and time than conventional "flattened" chip level parasitic extraction techniques.

Figure 5:
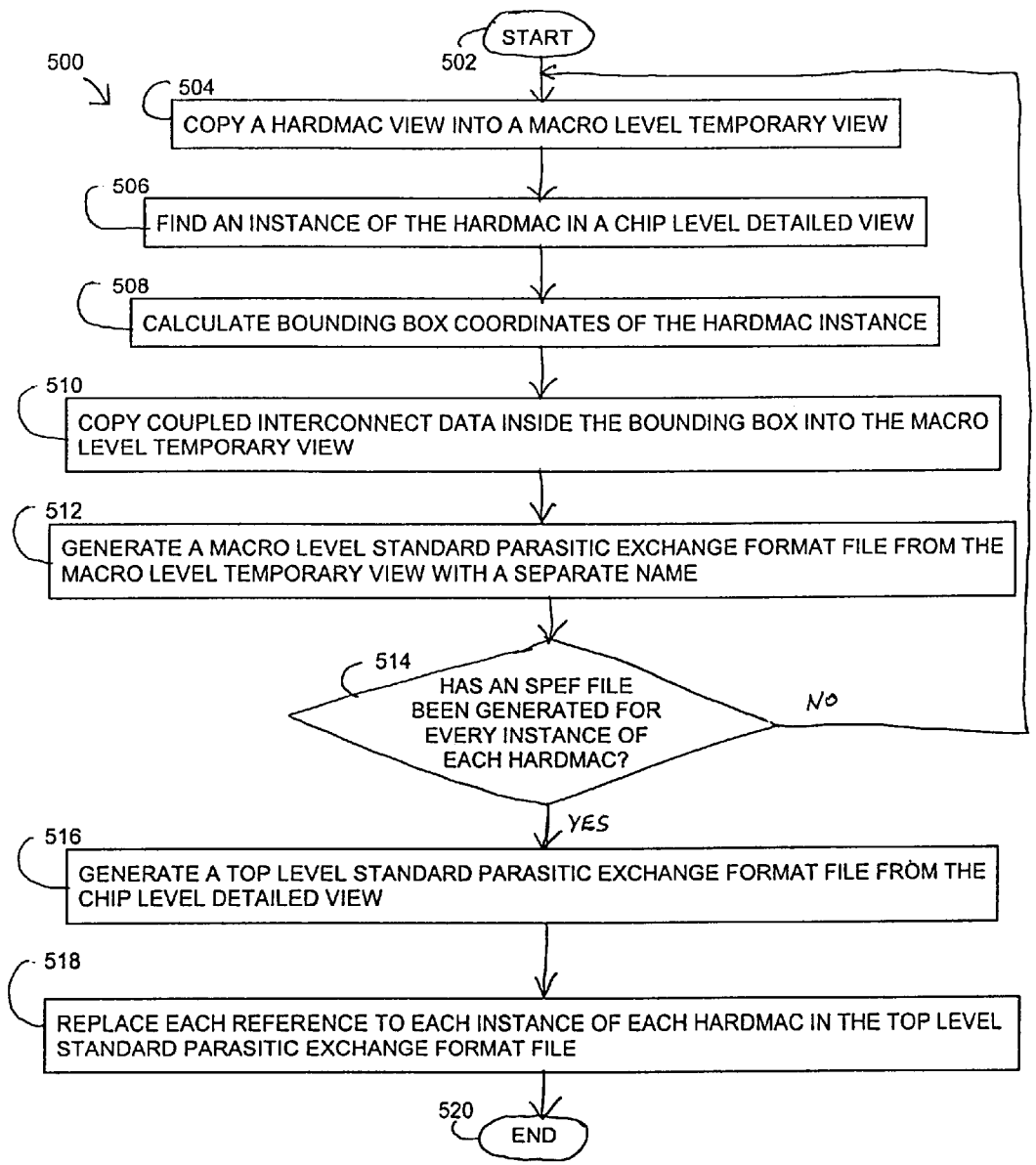
FIG. 5 is a flowchart of a method for extraction of interconnect parasitic data for an integrated circuit according to an embodiment of the present invention.

FIG. 5 is a flowchart 500 of a hierarchical method for extraction of interconnect parasitic data for integrated circuits. This method generates a set of hierarchical Standard Parasitic Exchange Format files that characterize the performance of each instance of each hardmac at each level of an integrated circuit design. A hierarchical parasitic extraction may be performed on the top level SPEF file to accurately predict the performance of the integrated circuit.

Step 502 is the entry point of the flowchart 500.

In step 504, a hardmac view of a hardmac instantiated in an integrated circuit design is copied into a macro level temporary view.

The following steps 506–518 may be run as a script on an extraction engine.

In step 506, an instance of the hardmac in the chip level design is found from the chip level detailed view.

In step 508, the bounding box coordinates of the hardmac instance are calculated from the chip level detailed view.

In step 510, the coupled interconnect data and polygon data inside the bounding box is copied from the chip level detailed view into the macro level temporary view. Polygon data within a certain distance outside the boundary should also be included to account for the coupling relationship between wires just outside the boundary at the chip level. If the extraction engine represents coupling between nets as capacitors to ground in the Standard Parasitic Exchange Format (SPEF), as in this example, then the net originally associated with the polygon data is not a factor. Alternatively, the net names may be mapped from the top level net names to the electrically equivalent nets in the macro level temporary view. In this arrangement, the rest of the coupled interconnects and polygon data that are copied down may simply be classified as ground nets in the context of the macro. The advantage of mapping the net names to the electrically equivalent nets in the macro level temporary view is that self-coupling would be properly modeled for nets that exist both at the top level and inside the hardmac.

In step 512, the extraction engine generates a macro level SPEF file from the macro level temporary view and assigns a separate name to the macro level SPEF file. The values for the parasitic data should be the same as if the extraction engine were run in the "flattened" chip mode. However, the hierarchical nature of the chip is still preserved and may be used for hierarchical Standard Parasitic Exchange Format (SPEF) post-layout, i.e., the macro level SPEF may be used for post-layout timing verification of the macro in context, as well as for full-chip timing verification. The macro level SPEF would not include entries for the coupled interconnects and polygon data copied down in this example because they would be seen by the extraction engine as ground nets and therefore these entries would not be extracted.

In step 514, control is transferred back to step 504 until a macro level SPEF file has been generated for every instance of each hardmac in the integrated circuit design.

In step 516, the extraction engine generates a top level SPEF file from the chip level detailed view. Note: If routing changes are made at the top level that affect the wires that run over the top of or near the boundaries of the hardmacs, then a new copy and extraction would be necessary for those macros affected.

In step 518, the references to the instantiated hardmacs in the top level SPEF file are inserted utilizing the names of the corresponding macro level SPEF files. Because all of the SPEF entries in the macro level SPEF files are relative to the logical context of the macro (not the top level chip), the references to the macro level SPEF files in the top level SPEF file-should specify that the macro level SPEF file path names are "relative". The references in the top level SPEF file should also include a unique instantiation prefix that identifies each macro level SPEF file to reflect the fact that each macro level file is different for each instance.

Step 520 is the exit point of the flowchart 500.

In the hierarchical method for extraction of interconnect parasitic data for integrated circuits described above, the representation of the coupled interconnects and the polygon data that is copied from an upper level to a lower level is simplified so that the coupled interconnects and the polygon data are considered to be ground wires. Also new is the feature of instance-specific management of hardmac data from copied hardmac views to create the final SPEF files using both chip level and macro level back-annotation in a hierarchical representation.

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

What is claimed is:

1. A method for extraction of interconnect parasitic data for integrated circuits comprising the steps of:

(a) copying a hardmac view of an instantiated hardmac into a macro level temporary view;

(b) finding an instance of the hardmac in a chip level design from a chip level detailed view;

(c) calculating bounding box coordinates of the instance of the hardmac from the chip level detailed view;

(d) copying coupled interconnect data inside the bounding box from the chip level detailed view into the macro level temporary view; and (e) generating a macro level SPEF file from the macro level temporary view.

2. The method of claim 1 wherein step (d) comprises copying polygon data inside the bounding box into the macro level temporary view.

3. The method of claim 1 wherein step (d) comprises copying polygon data within a selected distance from the bounding box into the macro level temporary view.

4. The method of claim 1 wherein step (d) comprises mapping net names from top level net names to electrically equivalent nets inside the hardmac.

5. The method of claim 1 wherein step (d) comprises representing coupling between nets as capacitors to ground.

6. The method of claim 1 further comprising the step of (f) assigning a separate name to the macro level SPEF file.

7. The method of claim 6 further comprising the step of (g) repeating steps (a) through (f) until a macro level SPEF file has been generated for each instance of the hardmac.

8. The method of claim 7 further comprising the step of (h) generating a top level SPEF file from the chip level detailed view.

9. The method of claim 8 further comprising the step of replacing each reference to each instance of the hardmac in the top level SPEF file by the separate name of each corresponding macro level SPEF file.

10. A method for extraction of interconnect parasitic data for integrated circuits comprising the steps of:

(a) copying a hardmac view of an instantiated hardmac into a macro level temporary view;

(b) finding an instance of the hardmac in a chip level design from a chip level detailed view;

(c) calculating bounding box coordinates of the instance of the hardmac from the chip level detailed view;

(d) copying coupled interconnect data inside the bounding box from the chip level detailed view into the macro level temporary view;

(e) generating a macro level SPEF file from the macro level temporary view;

(f) assigning a separate name to the macro level SPEF file;

(g) repeating steps (a) through (f) until a macro level SPEF file has been generated for each instance of the hardmac;

(h) generating a top level SPEF file from the chip level detailed view; and (i) replacing each reference to each instance of the hardmac in the top level SPEF file by the separate name of each corresponding macro level SPEF file.

* * * * *